US010555427B2

(12) United States Patent
Kurumaddali et al.

(10) Patent No.: US 10,555,427 B2
(45) Date of Patent: Feb. 4, 2020

(54) ELECTRONIC DEVICE WITH A MAGNETICALLY ATTACHED ELECTRONIC COMPONENT (71) Applicant: Microsoft Technology Licensing, LLC, Redmond, WA (US)

(72) Inventors: Kanth Kurumaddali, Sammamish, WA (US); Kenneth Charles Boman, Duvall, WA (US); David John Huston, Seattle, WA (US); Han Li, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 42 days.

(21) Appl. No.: 15/807,343

(22) Filed: Nov. 8, 2017

(65) Prior Publication Data
US 2019/0141846 A1 May 9, 2019

(51) Int. Cl.
H05K 5/02 (2006.01)
H05K 3/30 (2006.01)
(Continued)

(52) U.S. Cl.
CPC .......... H05K 5/0217 (2013.01); H05K 3/305 (2013.01); H05K 5/0017 (2013.01);
(Continued)

(58) Field of Classification Search
CPC .. H05K 5/0217; H05K 5/0043; H05K 5/0047; H05K 5/06; H05K 2203/104;
(Continued)

(56) References Cited

U.S. PATENT DOCUMENTS 4,851,116 A * 7/1989 Tomita .................... B03C 1/286
210/222
6,882,498 B2 4/2005 Kurumatani et al.
(Continued)

FOREIGN PATENT DOCUMENTS

JP         S63275198 A    11/1988
JP         2002217559 A    8/2002
WO    WO-2017111842 A1 *  6/2017  ............. H05K 7/142

OTHER PUBLICATIONS

"International Search Report and Written Opinion Issued in PCT Application No. PCT/US2018/058601", dated Feb. 21, 2019, 12 Pages.

Primary Examiner — Hoa C Nguyen
Assistant Examiner — Christopher L Augustin
(74) Attorney, Agent, or Firm — Rainier Patents, P.S.

(57) ABSTRACT

An electronic device with a magnetically attached electronic component is described herein. An electronic device includes a housing and an electronic component. The electronic component is positioned within the housing and magnetically attached to an internal surface of the housing via a magnetic force between the electronic component and the internal surface of the housing. During manufacturing, the electronic component can be magnetically attached to the internal surface of the housing by aligning one or more magnetic attachment points of the electronic component within magnetic proximity to one or more corresponding magnetic attachment points of the internal surface of the housing of the electronic device to magnetically attach the electronic component to the internal surface of the housing.

20 Claims, 6 Drawing Sheets (51) Int. Cl.
    *H05K 5/00*         (2006.01)
    *H05K 13/08*       (2006.01)
    *H05K 13/00*       (2006.01)

(52) U.S. Cl.
    CPC ......... *H05K 13/0015* (2013.01); *H05K 13/08* (2013.01); *H05K 2201/10537* (2013.01); *H05K 2203/104* (2013.01)

(58) Field of Classification Search
    CPC .... H05K 5/006; H05K 5/0234; H05K 7/1407; H05K 7/1402; H05K 7/142; H05K 2201/08; H05K 2201/083; H05K 2201/10409; H05K 2201/10424; G06F 1/1626; G06F 1/1633; G06F 1/1658; G06F 1/1637
    See application file for complete search history.

(56) References Cited

U.S. PATENT DOCUMENTS

| | | | |
|---|---|---|---|
| 7,679,859 B2 | 3/2010 | Hayakawa et al. | |
| 8,475,285 B2 | 7/2013 | Jarema, III et al. | |
| 9,474,345 B2 | 10/2016 | Smith et al. | |
| 9,600,034 B2 * | 3/2017 | Kiple | |
| 9,665,125 B2 | 5/2017 | Browning et al. | |
| 2004/0065176 A1* | 4/2004 | Lin | B25B 13/06 81/125 |
| 2008/0218299 A1* | 9/2008 | Arnold | B81C 1/00007 335/306 |
| 2011/0096513 A1 | 4/2011 | Kim | |
| 2012/0261870 A1* | 10/2012 | Hsieh | H05K 3/007 269/8 |
| 2013/0057559 A1 | 3/2013 | Kim et al. | |
| 2013/0135552 A1* | 5/2013 | Huang | G02F 1/133308 349/58 |
| 2013/0329359 A1* | 12/2013 | Andre | G06F 1/1616 361/679.55 |
| 2013/0343012 A1* | 12/2013 | Park | H05K 7/1417 361/750 |
| 2014/0192470 A1* | 7/2014 | Ho | G06F 1/1601 361/679.26 |
| 2014/0218954 A1* | 8/2014 | Yoon | H01L 33/62 362/546 |
| 2015/0118447 A1* | 4/2015 | Fujikawa | H05K 3/305 428/172 |
| 2017/0146890 A1* | 5/2017 | Shoemake | G03B 15/05 |
| 2017/0155746 A1* | 6/2017 | Yang | H04M 1/026 |
| 2017/0332494 A1* | 11/2017 | Park | G01P 15/0891 |
| 2018/0359345 A1* | 12/2018 | Weng | H05K 7/142 |

* cited by examiner

502
Obtain, by a device manufacturing system, a housing of an electronic device and an electronic component for the electronic device

504
Control machinery of the device manufacturing system to align one or more magnetic attachment points of the electronic component within magnetic proximity to one or more corresponding magnetic attachment points of an internal surface of the housing of the electronic device to magnetically attach the electronic component to the internal surface of the housing

ELECTRONIC DEVICE WITH A MAGNETICALLY ATTACHED ELECTRONIC COMPONENT

BACKGROUND

Electronic components, such as circuit boards, are conventionally attached to electronic devices using screws. Screws provide a robust and secure connection between the circuit board and the housing or chassis of the electronic device. However, using screws during manufacturing of an electronic device requires a long duration of cycle time. For instance, a typical motherboard for a laptop computing device with a CPU may require 10 to 15 screws to mount the motherboard to the laptop, which creates a long duration of cycle time on the assembly line as each screw must be manually installed. Using screws to attach the motherboard also presents re-workability challenges during manufacturing. In order to rework any component on the motherboard, all of the screws must be removed and the motherboard must be detached completely from the housing or chassis of the device. A typical re-work rate for a motherboard of a laptop may be as high as 5 to 10%. As such, using screws to attach the motherboard leads to high re-work costs and increased cycle times during manufacturing. Furthermore, screw stripping on the housing is a common problem during motherboard attachment. If the threads on the housing are stripped, the entire portion of the housing or chassis must be discarded, which leads to high scrap costs.

SUMMARY

An electronic device with a magnetically attached electronic component is described herein. An electronic device includes a housing and an electronic component. The electronic component is positioned within the housing and magnetically attached to an internal surface of the housing via a magnetic force between the electronic component and the internal surface of the housing. During manufacturing, the electronic component can be magnetically attached to the internal surface of the housing by aligning one or more magnetic attachment points of the electronic component within magnetic proximity to one or more corresponding magnetic attachment points of the internal surface of the housing of the electronic device to magnetically attach the electronic component to the internal surface of the housing.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

An electronic device with a magnetically attached electronic component is described herein. An electronic device includes a housing and an electronic component within the housing. Unlike existing devices which attach electronic components using screws or an adhesive, the electronic component is magnetically attached to an internal surface of the housing via a magnetic force between the electronic component and the internal surface of the housing. In some cases, the electronic component corresponds to a motherboard of the electronic device. However, a variety of different types electronic components may be magnetically attached to the internal surface of the housing without departing from the scope of the described techniques.

The electronic component may be magnetically attached to the internal surface of the housing via one or more magnetic attachment points. In one or more implementations, each magnetic attachment point includes a magnet on the internal surface of the housing that is magnetically attached to a corresponding magnetic element on the electronic component. The magnetic element may be formed from a magnetic material, such as steel, iron, and so forth. In some cases, the magnet on the internal surface of the housing protrudes from the internal surface of the housing and extends into a cavity on the corresponding magnetic element on the electronic component to magnetically attach the electronic component to the internal surface. Alternately, this order may be reversed such that each magnetic attachment point includes a magnet on the electronic component that is magnetically attached to a corresponding magnetic element on the internal surface of the housing. However, the magnetic attachment between the electronic component and the internal surface of the housing may be formed in a variety of different ways without departing from the spirit or scope of the described techniques.

Unlike existing devices in which electronic components are more permanently attached to the housing via screws or an adhesive, the described techniques enable electronic components to be attached via a magnetic force. Using a pure magnetic force to form the attachment significantly reduces the duration of cycle time during manufacturing as compared to conventional electronic devices. For example, instead of manually attaching multiple screws to form the attachment, the electronic component is aligned over the internal surface of the housing, and moved within a magnetic proximity to the housing to attach the electronic component to the internal surface of the housing via the magnetic force. Furthermore, in the event that the electronic component must be re-worked after it has been attached to the housing, a force can be applied to pull the electronic component off of the housing. This significantly reduces the cycle time for re-work compared to multiple devices which must unscrew multiple screws in order to remove an electronic component from the housing for re-work. Additionally, replacing screws with a magnetic attachment completely eliminates the problem of screw stripping on the housing, which reduces the high scrap cost associated with manufacturing electronic devices using conventional processes.

Figure 1:
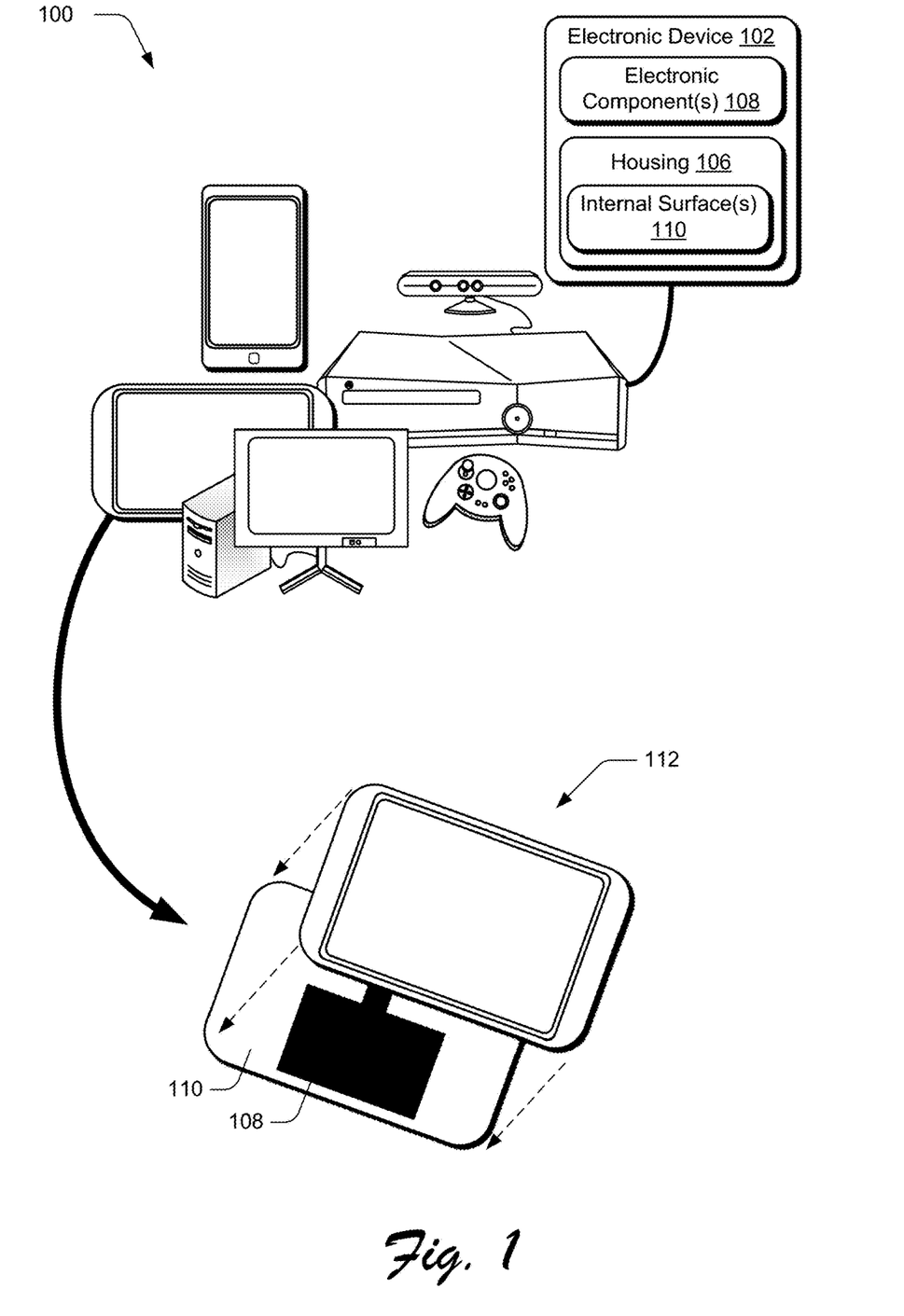
FIG. 1 is an illustration of an environment in an example implementation that is operable to employ the electronic device with a magnetically attached electronic component described herein.

FIG. 1 is an illustration of an environment 100 in an example implementation that is operable to employ the electronic device with a magnetically attached electronic component described herein. Environment 100 includes examples of an electronic device 102, may be configured in a variety of ways. As illustrated in FIG. 1, an electronic device 102 may be configured as a tablet computing device, a laptop computing device, a desktop computer, a smartphone, or a gaming system. The electronic device 102 may also be implemented as a peripheral device, such as a speaker, a keyboard, and so forth. However, the electronic device 102 is not limited by these examples, and may correspond to any type of electronic device or product. Thus, the electronic device 102 may range from full resource devices with substantial memory and processor resources (e.g., personal computers, game consoles) to a low-resource device with limited memory and/or processing resources (e.g., mobile devices). An example device is described in more detail with regards to FIG. 6.

Electronic device 102 is further illustrated as including a housing 106 and one or more electronic components 108. As described herein, the housing 106 of electronic device 102 corresponds to an enclosure, case, or chassis which encloses the one or more electronic components 108 of the electronic device 102. Notably, the housing 106 of electronic device 102 may be formed from a variety of different materials, and take on a variety of different form factors based on the type of device. For example, the form factor for the housing 106 of a tablet computing device is different than the form factor of the housing of a desktop computer, a smartphone, a head-mounted augmented reality (AR) or virtual (VR) device, and so forth.

In one or more implementations, the electronic component 108 corresponds to a motherboard of the electronic device 102. A motherboard is the main printed circuit board (PCB) found within electronic devices 102, and often includes many of the critical components essential to the functioning of the electronic device, such as the CPU, GPU, RAM, and so forth. However, as described herein, the electronic components 108 of electronic device 102 may correspond to any type of electronic component that is found within a housing of the device, such as PCBs and circuit boards other than the motherboard, displays, speakers, and so forth.

The housing 106 includes both external surfaces which are visible, as well as internal surfaces 110 which are not visible when the electronic device 102 is assembled. Unlike conventional electronic devices with "screwed-in" electronic components, the electronic component 108 of the electronic device 102 is magnetically attached to an internal surface of the housing 106 via a magnetic force between the electronic component and the internal surface of the housing.

For example, at 112, an electronic component 108, depicted as a motherboard for a tablet computing device, is shown as being magnetically attached to the internal surface 110 of the tablet computing device. In this example, the electronic component 108 is magnetically attached to an internal surface 110 on a bottom housing portion of the tablet computing device and thus is positioned between the bottom housing portion and a top housing portion, which includes a display, when the tablet computing device is assembled.

In some cases, the magnetic force magnetically attaches the electronic component 108 to the internal surface of the housing 106 without any additional forces. Doing so completely eliminates the need for screws, thereby solving the problems of conventional approaches. Alternately, in some cases, the magnetic force may be supplemented with one or more other forces, such as by securing the electronic component 108 to the internal surface of the housing with an adhesive, a reduced number of screws, and so forth.

The electronic component 108 may be magnetically attached to the internal surface 110 of the housing 106 via one or more magnetic attachment points. In one or more implementations, each magnetic attachment point includes a magnet on the internal surface 110 of the housing 106 that is magnetically attached to a corresponding magnetic element on the electronic component 108. As described herein, a magnet is a material or object that produces a magnetic field which is a force which pulls on other ferromagnetic materials, such as iron, and attracts or repels other magnets. A magnetic material, as described herein, corresponds to a ferromagnetic material or any type of material or element that is attracted to the magnetic field produced by a magnet. Examples of magnetic materials include, by way of example and not limitation, iron, nickel, and steel.

In some cases, the magnet protrudes from the internal surface 110 of the housing 106 and extends into a cavity on the corresponding magnetic element on the electronic component 108 to magnetically attach the electronic component 108 to the internal surface 110 of the housing 106. Alternately, this order may be reversed such that each magnetic attachment point includes a magnet on the electronic component 108 that is magnetically attached to a corresponding magnetic element on the internal surface 110 of the housing 106. However, the magnetic attachment between the electronic component 108 and the internal surface 110 of the housing 106 may be formed in a variety of different ways without departing from the spirit or scope of the described techniques.

In one or more implementations, one or more magnets can be positioned on the electronic component 108 and the internal surface 110 of the housing 106 is formed from a magnetic material. For example, the internal surface 110 of the housing 106 may be formed from a magnetic material such as steel, or from a non-magnetic material which be manipulated to make it magnetic, such as by nickel plating an aluminum housing. Similarly, if the housing is formed from a non-magnetic material, such as aluminum, the housing can include various magnetic touch points which are formed from a magnetic material, such as steel. In this instance, the electronic component is magnetically attached to the internal surface of the housing 106 via a magnetic force between the magnets on the electronic component and the magnetic material of the internal surface of the housing.

Figure 2:
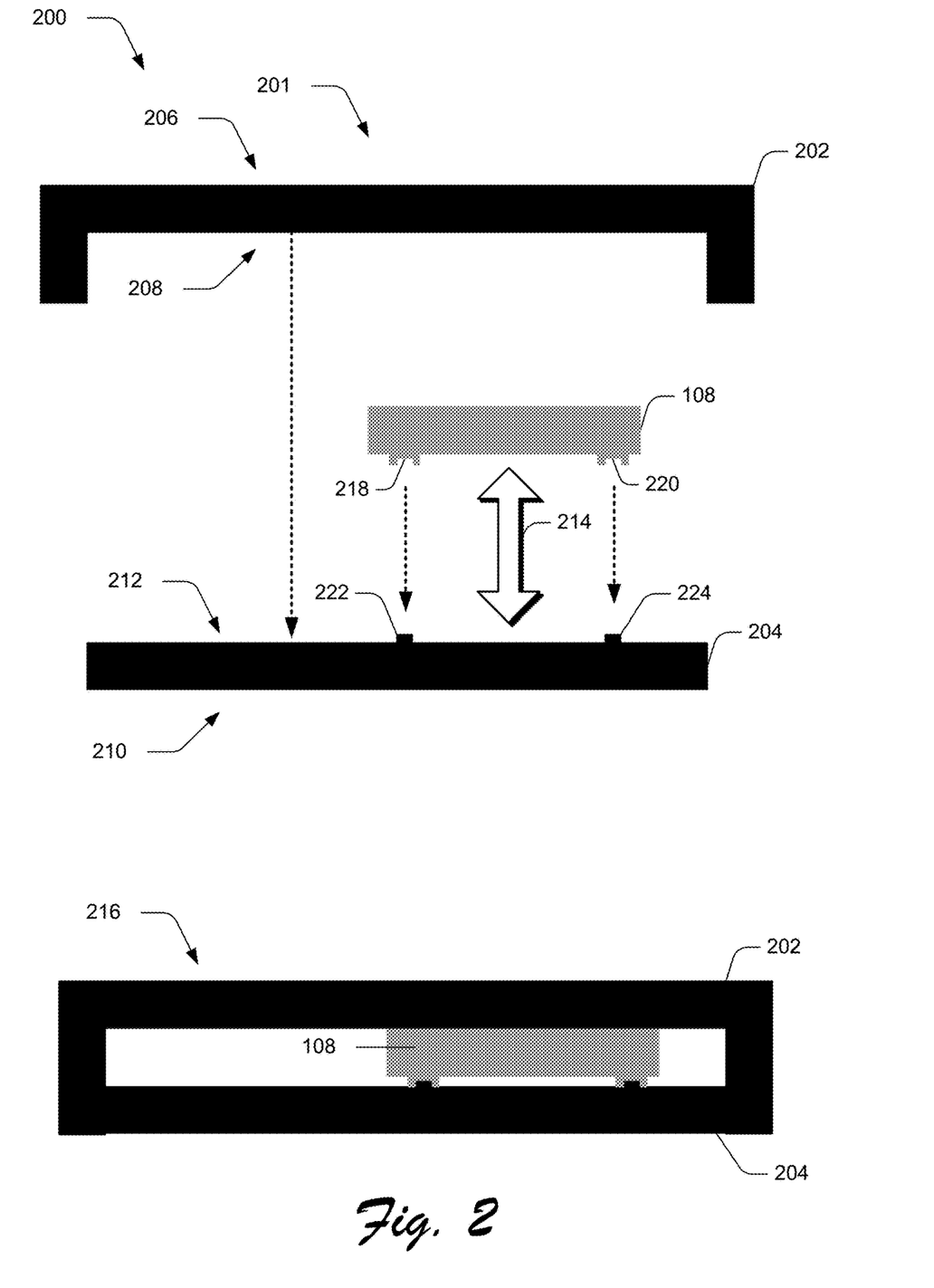
FIG. 2 illustrates an example of a cross-section view of an electronic component magnetically attached to an internal surface of a housing of an electronic device in accordance with one or more implementations.

FIG. 2 illustrates an example 200 of a cross-section view of an electronic component magnetically attached to an internal surface of a housing of an electronic device in accordance with one or more implementations.

At 201, an electronic device 102 includes a housing 106 which includes a top housing portion 202 and a bottom housing portion 204. Top housing portion 202 includes an external surface 206 and an internal surface 208, and a bottom housing portion 204 similarly includes an external surface 210 and an internal surface 212. In some cases, the bottom housing portion 204 corresponds to a chassis of the electronic device 102. As described throughout, external surfaces 206 and 210 of the housing 106 are visible to a user, whereas the internal surfaces 208 and 212 are not visible when the electronic device is assembled. By way of example and not limitation, the external surface 206 of top housing portion 202 may correspond to the "display side" of a tablet computing device, whereas the external surface 210 of the bottom housing portion 204 corresponds to a "back side" of the tablet computing device.

Example 200 further illustrates an electronic component 108, which as discussed above, may correspond to any type of electronic component, such as a motherboard. A magnetic force 214 enables the electronic component 108 to magnetically attach to internal surface 212 of bottom housing portion 204 when the electronic component 108 is positioned within a certain proximity of the internal surface 212 to form the magnetic attachment. Notably, the magnetic force 214 enables the magnetic attachment without the use of screws.

At 216, a cross section view of the electronic device 102 is shown in an assembled state, in which the top housing portion 202 is secured to the bottom housing portion 204. The electronic component 108 is magnetically attached to the internal surface 212 of bottom housing portion 204, via magnetic force 214, such that the electronic component 108 is positioned between the top and bottom housing portions 202 and 204, respectively.

In one or more implementations, the magnetic force 214 is caused by aligning magnetic attachment points 218 and 220 on electronic component 108 with corresponding magnetic attachment points 222 and 224 on the internal surface 212 of bottom housing portion 204. In this example, magnetic attachment points 222 and 224 on the internal surface 212 of bottom housing portion 204 correspond to magnets which protrude from the internal surface 212 and magnetically attach to magnetic elements at the magnetic attachment points 218 and 220 of electronic component 108. The magnetic elements at magnetic attachment points 218 and 220 include a cavity. The magnets at magnetic attachment points 222 and 224 of the internal surface 212 protrude from the internal surface 212 and extend into the cavity of the corresponding magnetic element at magnetic attachment points 218 and 220 of the electronic component 108 to magnetically attach the electronic component 108 to the internal surface 212 of the bottom housing portion 204.

The number of magnets and the positioning of the magnets may vary based on the type of the device, or the size, weight, or shape of the electronic component. For example, for a smartphone, electronic components may be attached using 2 or 3 magnets, due to the smaller size of the smartphone. In contrast, a motherboard for a tablet computing device, a laptop, or a desktop computer may be attached using a greater number of magnets, such as 10 or more magnets.

In one or more implementations, the external surface 206 of top housing portion 202 may include a display, such as a display for a tablet computing device, laptop computing device, or smartphone. The top housing portion 202 may be bonded to the bottom housing portion 204 in a variety of different ways, such as be gluing the portions together. Alternately, in one or more implementations, the top housing portion 202 includes a display and is magnetically attached to the bottom housing portion 204. Doing so reduces costs associated with re-work of the display during manufacturing in cases where the display is bonded to the housing and often comes damaged when pulled off.

Figure 3:
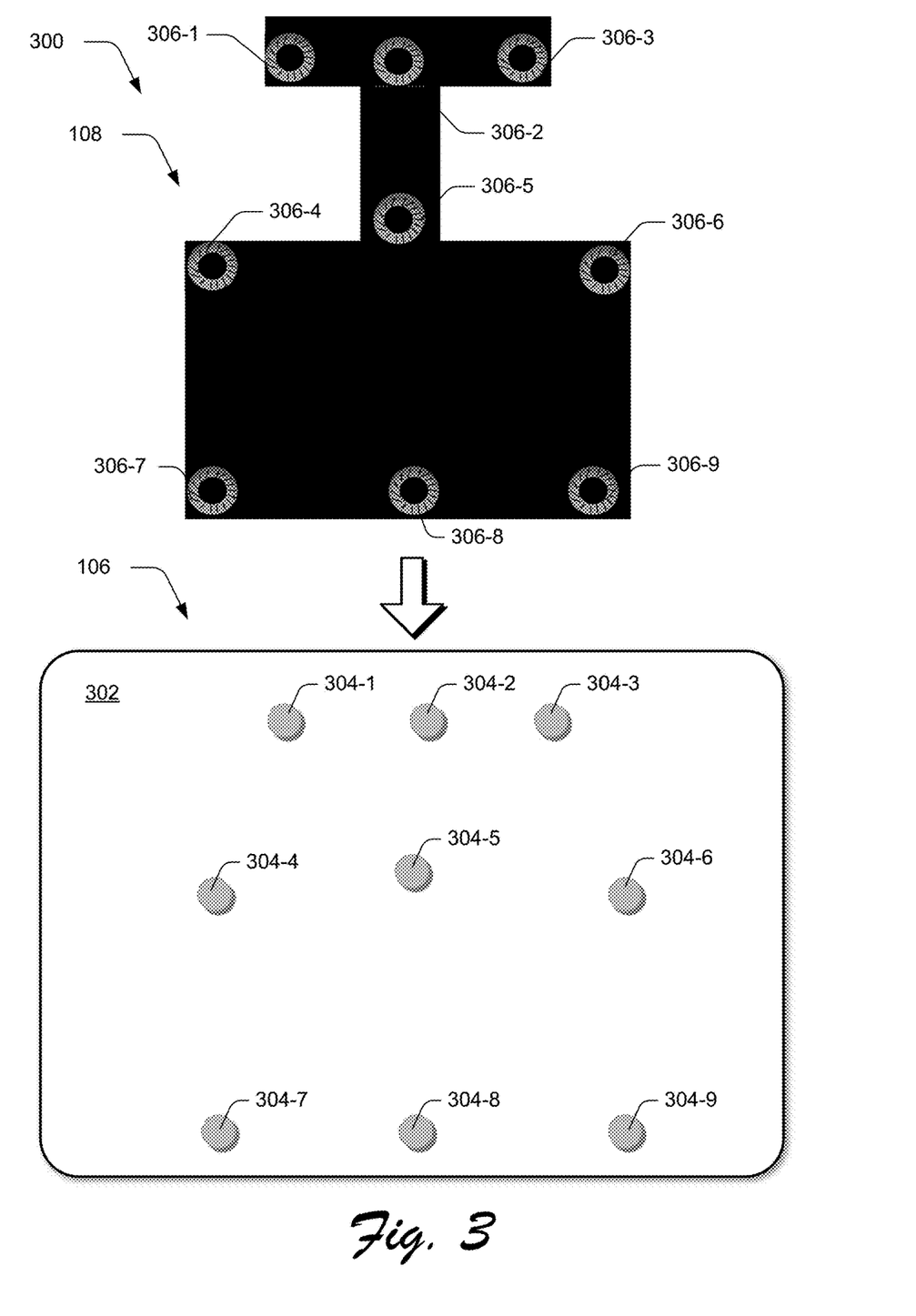
FIG. 3 illustrates an additional example of an electronic component which can be magnetically attached to an internal surface of a housing of an electronic device via multiple magnets on the internal surface of the housing and corresponding magnetic elements on the electronic component.

FIG. 3 illustrates an additional example 300 of an electronic component which can be magnetically attached to an internal surface of a housing of an electronic device via multiple magnets on the internal surface of the housing and corresponding magnetic elements on the electronic component.

In FIG. 3, an internal surface 302 of a housing 106 is illustrated, which in this example has a form factor corresponding to a chassis of a tablet computing device. The internal surface 302 of the housing 106 includes multiple magnets 304, which are represented as magnets 304-1, 304-2, 304-3, 304-4, 304-5, 304-6, 304-7, 304-8, and 304-9. In this example, each magnet 304 protrudes from the internal surface 302 of the housing 106.

In some cases, the magnets 304 are secured to the internal surface 302 of the housing after the housing is manufactured via an adhesive, such as by gluing the magnets 304 to the internal surface 302 of the housing 106. Doing so enables manufacture of a clean chassis, which reduces the complexity, and thus costs, associated with manufacturing the chassis. Conventional devices, in contrast, manufacture the chassis to include "bosses" which are configured to receive screws to secure the electronic component to the chassis. Alternately, the magnets may be formed as part of the housing.

In FIG. 3, an electronic component 108 is illustrated with a form factor corresponding to a motherboard for the electronic device 102. The electronic component 108 includes magnetic elements 306-1, 306-2, 306-3, 306-4, 306-5, 306-6, 306-7, 306-8, and 306-9, which are configured to align with corresponding magnets 304-1, 304-2, 304-3, 304-4, 304-5, 304-6, 304-7, 304-8, and 304-9 of the internal surface 302 of electronic device 102. Each magnetic element 306 of the electronic component 108 includes a cavity which is configured to receive the protrusion of the respective magnet of the internal surface of the housing in order to form the magnetic attachment. The magnetic elements 306, in this example, corresponds to a nut, such as a swage nut, which is formed from a material that will form a magnetic attachment with the magnet on the internal surface of the housing, such as steel. These nuts are often used with screws to attach electronic components to a housing, thus in some cases the magnetic attachment is enabled without the need to redesign an electronic component designed to be screwed into a housing.

During manufacturing of electronic device 102, the electronic component 108 can be magnetically attached to the internal surface 110 of the housing 106 by placing the electronic component 108 within a magnetic proximity of the internal surface of the housing 106, such that the magnetic force between the magnetic attachment points attaches the electronic component to the internal surface of the housing. In some cases, the magnetic touch points naturally attract, thereby causing the magnets on the internal surface of the housing 106 or the electronic component 108 to attach to the corresponding magnet touch points on the electronic component 108 or the internal surface of the housing, respectively. Thus, alignment of the electronic component with the housing can be performed by moving the electronic component within proximity to the internal surface of the housing to cause the electronic component to attach to the internal surface of the housing.

Alternately or additionally, alignment features of the internal surface of the housing and the electronic component may be utilized to align the electronic component with the housing. For example, an alignment "pin" or protrusion may be positioned on the internal surface of the housing 106, which is configured to extend through a corresponding hole or cavity on the electronic component 108. In this instance, in order to properly align the electronic component on the housing, the electronic component is moved to align the pin or protrusion within the corresponding hole or cavity.

The electronic component 108 can be magnetically attached to the internal surface of the housing 106 of electronic device 102 as a manual or automated process. For example, in some cases an automated machine or assembly process may be utilized to attach the electronic component 108 to the electronic device.

Figure 4:
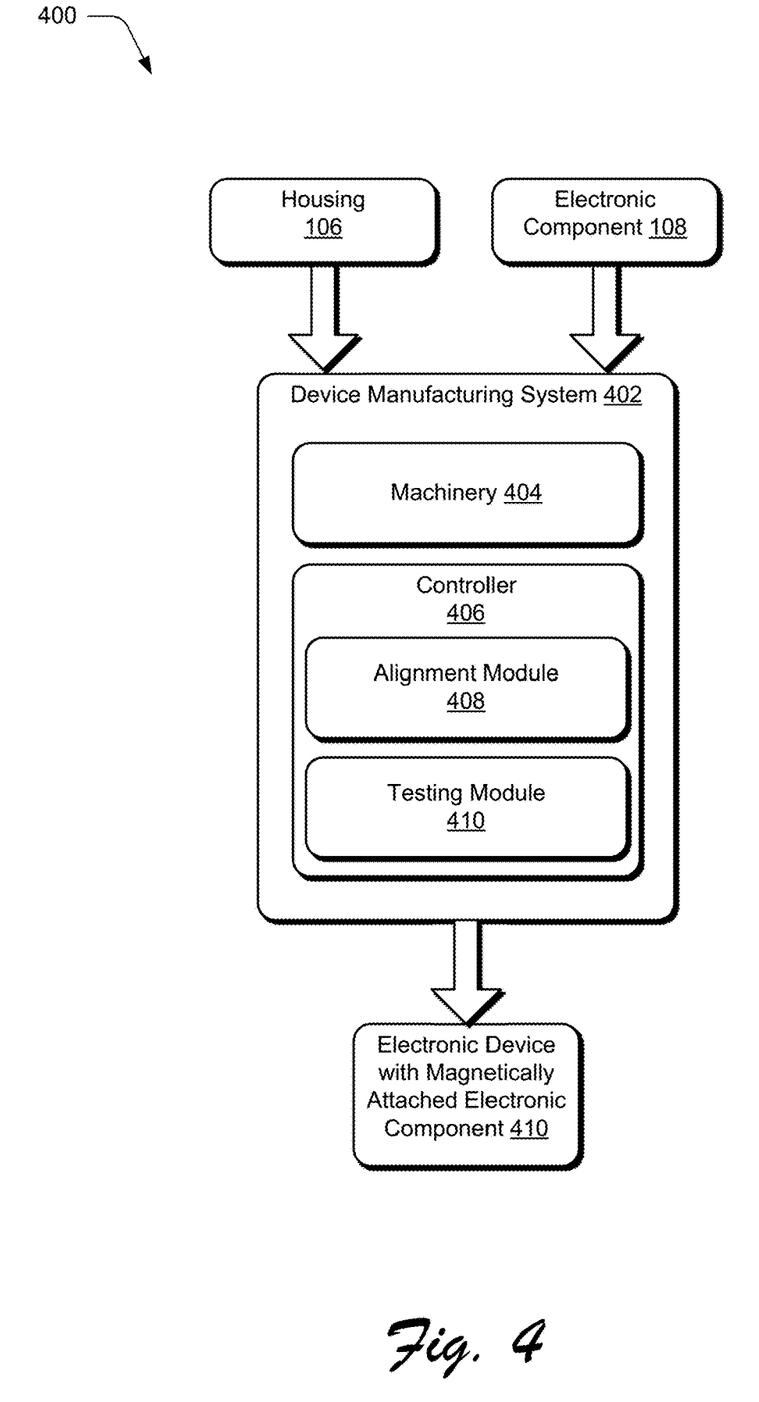
FIG. 4 illustrates a system for magnetically attaching an electronic component to an internal surface of a housing of an electronic device in accordance with one or more implementations.

Consider, for example, FIG. 4 which illustrates a system 400 for magnetically attaching an electronic component to an internal surface of a housing of an electronic device in accordance with one or more implementations.

In system 400, a device manufacturing system 402 is configured to manufacture electronic components using machinery 404 which is controlled by a controller 406. Controller 406 is representative of functionality for controlling the machinery 404 to assemble electronic devices 102. In this example, controller 406 includes an alignment module 408 which can be utilized by controller 406 to generate an electronic device with magnetically attached electronic component 410 by attaching an electronic component 108, such as a motherboard, to an internal surface 110 of a housing 106 of an electronic device 102, such as a chassis of a tablet computing device.

In this example, the device manufacturing system 402 obtains an electronic component 108 and a housing 106 of an electronic device 102. Alignment module 408 controls machinery 404 to align one or more magnetic attachment points of the electronic component 108 within a magnetic proximity to one or more corresponding magnetic attachment points of an internal surface of the housing 106 of electronic device 102 to magnetically attach the electronic component to the internal surface of the housing. For example, the alignment module 408 may control the machinery 404 to move the electronic component 108 so that the magnets of the internal surface of the housing 106 are within magnetic proximity to the corresponding magnetic elements of the electronic component. As described herein, a magnetic proximity corresponds to a distance at which the magnet field generated by the magnets of the internal surface of the housing or the electronic component magnetically attract and attach the magnetic elements of the electronic component. Once aligned, the alignment module 408 may control the machinery 404 to release the electronic component 108 to cause the electronic component 108 to magnetically attach to the internal surface of the housing 106 via the magnetic force between the magnetic attachment points.

Device manufacturing system 402 is further illustrated as including a testing module 412, which is configured to test various components of the assembled electronic device 102 to detect errors. For example, the testing module 412 may test various components of the electronic component when implemented as a motherboard, such as CPU, GPU, and so forth, to ensure that the attached electronic component is functioning properly. In some instances, the testing module 412 may detect errors in the electronic component, which requires the electronic component to be removed and "reworked".

If an error in the magnetically attached electronic component is detected, the controller 406 controls machinery 404 to remove the magnetically attached electronic component 108 from the internal surface of the housing 106 of the electronic device 102. To do so, the machinery 404 grabs the electronic component 108, such as via a suction cup, and simply applies a force opposite the magnetic force in order to remove the electronic component from the internal surface of the housing 106. Once the errors in the electronic component 108 are fixed, the alignment module 408 may control machinery 404 to re-attach the electronic component 108 to the internal surface of the housing 106, as described above.

Figure 5:
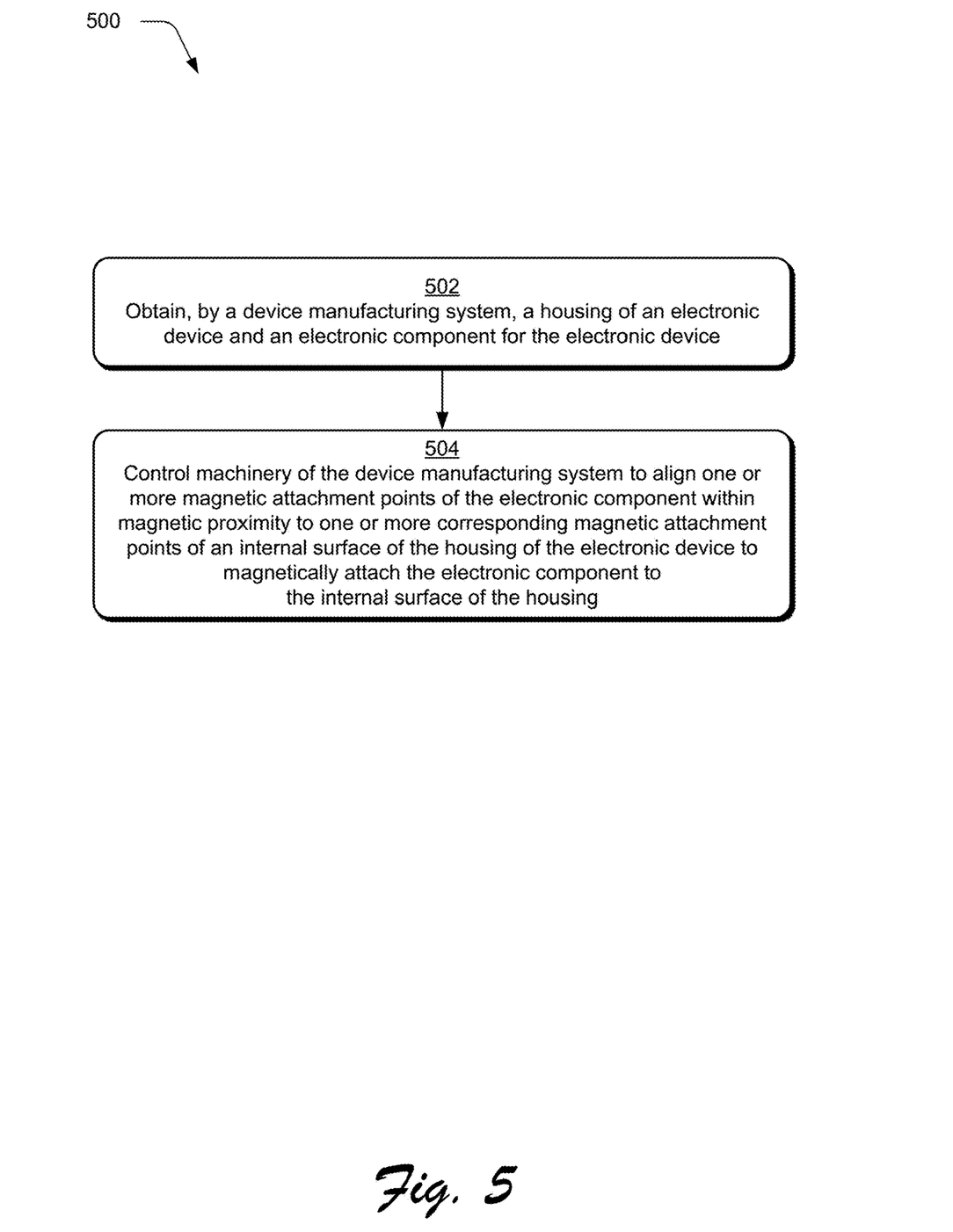
FIG. 5 depicts an example procedure of magnetically attaching an electronic component to an internal surface of a housing of an electronic device.

FIG. 5 depicts an example procedure 500 of magnetically attaching an electronic component to an internal surface of a housing of an electronic device. Aspects of this procedure may be implemented in hardware, firmware, or software, or a combination thereof. The procedures are shown as a set of blocks that specify operations performed by one or more devices and are not necessarily limited to the orders shown for performing the operations by the respective blocks.

An electronic component and a housing of an electronic device is obtained by a device manufacturing system (block 502). By way of example, device manufacturing system 402 obtains an electronic component 108, such as a motherboard, and a housing 106 of an electronic device 102, such as a tablet computing device.

Machinery of the device manufacturing system is controlled to align one or more magnetic attachment points of the electronic component within a magnetic proximity to one or more corresponding magnetic attachment points of an internal surface of the housing of the computing device to magnetically attach the electronic component to the internal surface of the housing (block 504). By way of example, a controller 406 of the device manufacturing system 402 controls machinery 404 to align one or more magnetic attachment points of the electronic component 108 within a magnetic proximity to one or more corresponding magnetic attachment points of an internal surface 110 of the housing 106 of electronic device 102 to magnetically attach the electronic component to the internal surface of the housing.

In one or more implementations, a testing module 410 is configured to test the magnetically attached electronic component 108 to detect one or more errors. Responsive to detecting one or more errors, controller 406 controls the machinery 404 to remove the magnetically attached electronic component 108 from the internal surface 110 of the housing 106. Then, responsive to fixing the one or more errors, the alignment module 108 controls the machinery 404 of the device manufacturing system 402 to align the one or more magnetic attachment points of the electronic component 108 within magnetic proximity to the one or more corresponding magnetic attachment points of an internal surface 110 of the housing 106 of the electronic device 102 to magnetically re-attach the electronic component 108 to the internal surface 110 of the housing 106.

Figure 6:
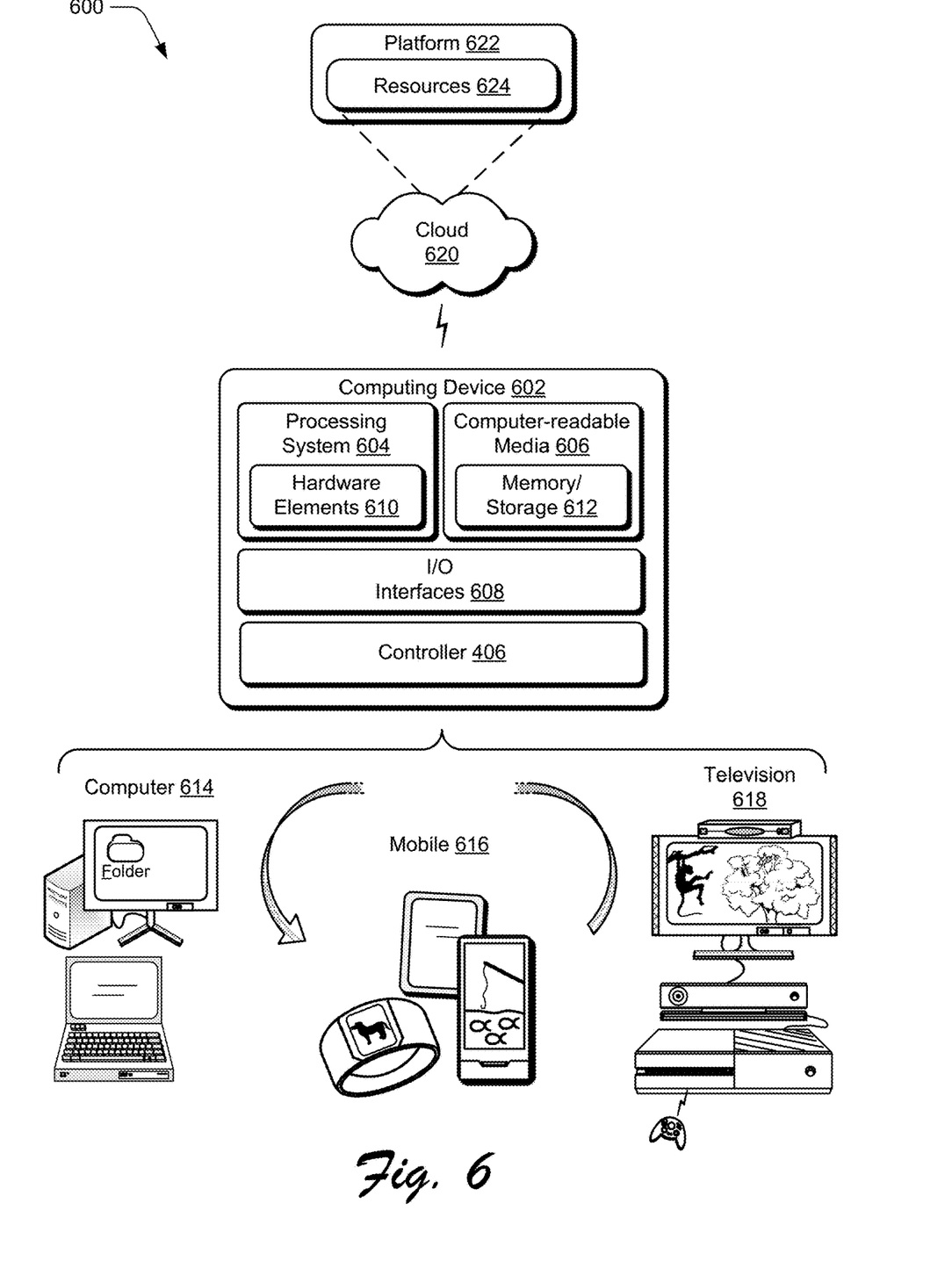
FIG. 6 illustrates an example system that includes an example computing device that is representative of one or more computing systems and/or devices that may implement the various techniques described herein.

FIG. 6 illustrates an example system generally at 600 that includes an example computing device 602 that is representative of one or more computing systems and/or devices that may implement the various techniques described herein. The example computing device 602, for example, may be implemented as the electronic device 102 with a magnetically attached electronic component 108 discussed throughout. The example computing device 602 may also be implemented as a computing device of the device manufacturing system 402. This is illustrated through inclusion of the controller 406. The computing device 602 may be, for example, a server of a service provider, a device associated with a client (e.g., a client device), an on-chip system, and/or any other suitable computing device or computing system.

The example computing device 602 as illustrated includes a processing system 604, one or more computer-readable media 606, and one or more I/O interface 608 that are communicatively coupled, one to another. Although not shown, the computing device 602 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 604 is representative of functionality to perform one or more operations using hardware. Accordingly, the processing system 604 is illustrated as including hardware element 610 that may be configured as processors, functional blocks, and so forth. This may include implementation in hardware as an application specific integrated circuit or other logic device formed using one or more semiconductors. The hardware elements 610 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable storage media 606 is illustrated as including memory/storage 612. The memory/storage 612 represents memory/storage capacity associated with one or more computer-readable media. The memory/storage component 612 may include volatile media (such as random access memory (RAM)) and/or nonvolatile media (such as read only memory (ROM), Flash memory, optical disks, magnetic disks, and so forth). The memory/storage component 612 may include fixed media (e.g., RAM, ROM, a fixed hard drive, and so on) as well as removable media (e.g., Flash memory, a removable hard drive, an optical disc, and so forth). The computer-readable media 606 may be configured in a variety of other ways as further described below.

Input/output interface(s) 608 are representative of functionality to allow a user to enter commands and information to computing device 602, and also allow information to be presented to the user and/or other components or devices using various input/output devices. Examples of input devices include a keyboard, a cursor control device (e.g., a mouse), a microphone, a scanner, touch functionality (e.g., capacitive or other sensors that are configured to detect physical touch), a camera (e.g., which may employ visible or non-visible wavelengths such as infrared frequencies to recognize movement as gestures that do not involve touch), and so forth. Examples of output devices include a display device (e.g., a monitor or projector), speakers, a printer, a network card, tactile-response device, and so forth. Thus, the computing device 602 may be configured in a variety of ways as further described below to support user interaction.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 602. By way of example, and not limitation, computer-readable media may include "computer-readable storage media" and "computer-readable signal media."

"Computer-readable storage media" may refer to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Computer-readable signal media" may refer to a signal-bearing medium that is configured to transmit instructions to the hardware of the computing device 602, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 610 and computer-readable media 606 are representative of modules, programmable device logic and/or fixed device logic implemented in a hardware form that may be employed in some examples to implement at least some aspects of the techniques described herein, such as to perform one or more instructions. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 610. The computing device 602 may be configured to implement particular instructions and/or functions corresponding to the software and/or hardware modules. Accordingly, implementation of a module that is executable by the computing device 602 as software may be achieved at least partially in hardware, e.g., through use of computer-readable storage media and/or hardware elements 610 of the processing system 604. The instructions and/or functions may be executable/operable by one or more articles of manufacture (for example, one or more computing devices 602 and/or processing systems 604) to implement techniques, modules, and examples described herein.

As further illustrated in FIG. 6, the example system 600 enables ubiquitous environments for a seamless user experience when running applications on a personal computer (PC), a television device, and/or a mobile device. Services and applications run substantially similar in all three environments for a common user experience when transitioning from one device to the next while utilizing an application, playing a video game, watching a video, and so on.

In the example system 600, multiple devices are interconnected through a central computing device. The central computing device may be local to the multiple devices or may be located remotely from the multiple devices. In one implementation, the central computing device may be a cloud of one or more server computers that are connected to the multiple devices through a network, the Internet, or other data communication link.

In an implementation, this interconnection architecture enables functionality to be delivered across multiple devices to provide a common and seamless experience to a user of the multiple devices. Each of the multiple devices may have different physical requirements and capabilities, and the central computing device uses a platform to enable the delivery of an experience to the device that is both tailored to the device and yet common to all devices. In another implementation, a class of target devices is created and experiences are tailored to the generic class of devices. A class of devices may be defined by physical features, types of usage, or other common characteristics of the devices.

In various implementations, the computing device 602 may assume a variety of different configurations, such as for computer 614, mobile 616, and television 618 uses. Each of these configurations includes devices that may have generally different constructs and capabilities, and thus the computing device 602 may be configured according to one or more of the different device classes. For instance, the computing device 602 may be implemented as the computer 614 class of a device that includes a personal computer, desktop computer, a multi-screen computer, laptop computer, netbook, and so on.

The computing device 602 may also be implemented as the mobile 616 class of device that includes mobile devices, such as a mobile phone, wearables (e.g., wrist bands, pendants, rings, etc.) portable music player, portable gaming device, a tablet computer, a multi-screen computer, and so on. The computing device 602 may also be implemented as the television 618 class of device that includes devices having or connected to generally larger screens in casual viewing environments. These devices include televisions, set-top boxes, gaming consoles, and so on. Other devices are also contemplated, such as appliances, thermostats and so on as part of the "Internet of Things."

The techniques described herein may be supported by these various configurations of the computing device 602 and are not limited to the specific examples of the techniques described herein. This functionality may also be implemented all or in part through use of a distributed system, such as over a "cloud" 620 via a platform 622 as described below.

The cloud 620 includes and/or is representative of a platform 622 for resources 624. The platform 622 abstracts underlying functionality of hardware (e.g., servers) and software resources of the cloud 620. The resources 624 may include applications and/or data that can be utilized while computer processing is executed on servers that are remote from the computing device 602. Resources 624 can also include services provided over the Internet and/or through a subscriber network, such as a cellular or Wi-Fi network.

The platform 622 may abstract resources and functions to connect the computing device 602 with other computing devices. The platform 622 may also serve to abstract scaling of resources to provide a corresponding level of scale to encountered demand for the resources 624 that are implemented via the platform 622. Accordingly, in an interconnected device, implementation of functionality described herein may be distributed throughout the system 600. For example, the functionality may be implemented in part on the computing device 602 as well as via the platform 622 that abstracts the functionality of the cloud 620.

Example implementations described herein include, but are not limited to, one or any combinations of one or more of the following examples:

In one or more examples, an electronic device comprises: a housing; and an electronic component for the electronic device, the electronic component positioned within the housing and magnetically attached to an internal surface of the housing via a magnetic force between the electronic component and the internal surface of the housing.

An example as described alone or in combination with any of the other examples described above or below, wherein the electronic component is magnetically attached to the internal surface of the housing via one or more magnetic attachment points.

An example as described alone or in combination with any of the other examples described above or below, wherein the one or more magnetic attachment points include a magnet on the internal surface of the housing that is magnetically attached to a corresponding magnetic element on the electronic component.

An example as described alone or in combination with any of the other examples described above or below, wherein the magnet is bonded to the internal surface of the housing via an adhesive.

An example as described alone or in combination with any of the other examples described above or below, wherein the magnet is formed as a part of the housing.

An example as described alone or in combination with any of the other examples described above or below, wherein the magnet on the internal surface of the housing protrudes from the internal surface of the housing and extends into a cavity of the corresponding magnetic element on the electronic component to magnetically attach the electronic component to the internal surface of the housing.

An example as described alone or in combination with any of the other examples described above or below, wherein the magnetic element comprises a nut attached to the electronic component, and wherein the cavity corresponds to a hole of the nut.

An example as described alone or in combination with any of the other examples described above or below, wherein the one or more magnetic attachment points include a magnet on the electronic component that is magnetically attached to a corresponding magnetic element on the electronic component.

An example as described alone or in combination with any of the other examples described above or below, wherein the internal surface of the housing is formed from a magnetic material, and wherein the magnetic attachment is formed by one or more magnets of the electronic component magnetically attaching to the magnetic material of the internal surface of the housing.

An example as described alone or in combination with any of the other examples described above or below, further comprising an alignment feature to align the electronic component with the internal surface of the housing, the alignment feature comprising a protrusion on the internal surface of the housing which extends into or through a corresponding hole or cavity on the electronic component.

An example as described alone or in combination with any of the other examples described above or below, wherein the electronic component comprises a circuit board of the electronic device.

An example as described alone or in combination with any of the other examples described above or below, wherein the housing comprises a top housing portion and a bottom housing portion, and wherein the top housing portion comprises a display, and wherein the electronic component is magnetically attached to the internal surface on the bottom housing portion such that the electronic component is positioned between the internal surface of the housing and the display.

An example as described alone or in combination with any of the other examples described above or below, wherein the display is magnetically attached to the housing.

In one or more examples, a computer-implemented method implemented by a device manufacturing system to magnetically attach an electronic component to an internal surface of a housing of an electronic device comprises: obtaining, by the device manufacturing system, a housing of an electronic device and an electronic component for the electronic device; and controlling machinery of the device manufacturing system to align one or more magnetic attachment points of the electronic component within magnetic proximity to one or more corresponding magnetic attachment points of an internal surface of the housing of the electronic device to magnetically attach the electronic component to the internal surface of the housing.

An example as described alone or in combination with any of the other examples described above or below, further comprising: testing the magnetically attached electronic component to detect one or more errors; responsive to detecting one or more errors, removing the magnetically attached electronic component from the internal surface of the housing; and responsive to fixing the one or more errors, controlling the machinery of the device manufacturing system to align the one or more magnetic attachment points of the electronic component within magnetic proximity to the one or more corresponding magnetic attachment points of an internal surface of the housing of the electronic device to magnetically re-attach the electronic component to the internal surface of the housing.

In one or more examples, an electronic device comprises: a housing comprising a top housing portion and a bottom housing portion, the top housing portion comprising a display and the bottom housing portion comprising an internal surface, the internal surface comprising multiple magnets; and a circuit board for the electronic device, the circuit board comprising multiple magnetic elements, the circuit board magnetically attached to the internal surface of the bottom portion of the housing via a magnetic force between each of the multiple magnets of the internal surface of the bottom housing portion and the corresponding magnetic elements of the circuit board such that the circuit board is positioned within the housing between the top housing portion and the bottom housing portion.

An example as described alone or in combination with any of the other examples described above or below, wherein the circuit board comprises a motherboard for the electronic device.

An example as described alone or in combination with any of the other examples described above or below, wherein the multiple magnetic elements of the circuit board comprise a nut formed from a magnetic material.

An example as described alone or in combination with any of the other examples described above or below, wherein each of the multiple magnets on the internal surface of the bottom housing portion protrude from the internal surface of the bottom housing portion and extend into a cavity of the corresponding nut formed from the magnetic material on the circuit board.

An example as described alone or in combination with any of the other examples described above or below, wherein the circuit board is attached to the internal surface of the bottom housing portion via the magnetic force without any additional forces.

Although the example implementations have been described in language specific to structural features and/or methodological acts, it is to be understood that the implementations defined in the appended claims is not necessarily limited to the specific features or acts described. Rather, the specific features and acts are disclosed as example forms of implementing the claimed features.

What is claimed is:

1. An electronic device comprising:
    a housing having a display side portion and a back side portion opposite the display side portion; and
    a circuit board for the electronic device, the circuit board positioned within the housing and magnetically attached to an internal surface of the back side portion of the housing via a magnetic force between a plurality of discrete magnetic attachment points on the circuit board and a plurality of corresponding discrete magnetic attachment points on the internal surface of the back side portion of the housing.

2. The electronic device as described in claim 1, wherein the circuit board comprises a motherboard.

3. The electronic device as described in claim 1, wherein the corresponding discrete magnetic attachment points on the internal surface of the back side portion of the housing comprise magnets and the discrete magnetic attachment points on the circuit board comprise respective magnetic elements on the circuit board that are magnetically attached to the magnets.

4. The electronic device as described in claim 3, wherein the magnets are bonded to the internal surface of the back side portion of the housing via an adhesive.

5. The electronic device as described in claim 3, wherein the magnets are formed as a part of the back side portion of the housing.

6. The electronic device as described in claim 3, wherein the magnets protrude from the internal surface of the back side portion of the housing and extend into cavities of the respective magnetic elements on the circuit board to magnetically attach the circuit board to the internal surface of the back side portion of the housing.

7. The electronic device as described in claim 6, wherein each magnetic element comprises a nut attached to the circuit board, and wherein each cavity corresponds to a hole of a particular nut.

8. The electronic device as described in claim 1, wherein the plurality of discrete magnetic attachment points on the circuit board include a plurality of magnets that are magnetically attached to corresponding magnetic elements on the internal surface of the back side portion of the housing.

9. The electronic device as described in claim 1, wherein the internal surface of the back side portion of the housing is formed from a magnetic material, and wherein the circuit board comprises one or more magnets magnetically attached to the magnetic material of the internal surface of the back side portion of the housing.

10. The electronic device as described in claim 1, further comprising an alignment feature to align the circuit board with the internal surface of the back side portion of the housing, the alignment feature comprising a protrusion on the internal surface of the back side portion of the housing which extends into or through a corresponding hole or cavity on the circuit board.

11. The electronic device as described in claim 1, embodied as a tablet device.

12. The electronic device as described in claim 1, wherein the display side portion comprises a display, and wherein the circuit board is positioned between the internal surface of the back side portion of the housing and the display.

13. The electronic device as described in claim 12, wherein the display is magnetically attached to the housing.

14. An electronic device comprising:
  a housing comprising a top housing portion and a bottom housing portion, the top housing portion comprising a display and the bottom housing portion comprising an internal surface, the internal surface comprising multiple discrete magnetic attachment points; and
  a circuit board for the electronic device, the circuit board comprising multiple corresponding discrete magnetic attachment points, the circuit board magnetically attached to the internal surface of the bottom housing portion via a magnetic force between each of the multiple discrete magnetic attachment points of the internal surface of the bottom housing portion and the multiple corresponding discrete magnetic attachment points of the circuit board such that the circuit board is positioned within the housing between the top housing portion and the bottom housing portion.

15. The electronic device as described in claim 14, wherein the circuit board comprises a motherboard for the electronic device.

16. The electronic device as described in claim 14, wherein the multiple corresponding discrete magnetic attachment points of the circuit board comprise nuts formed from a magnetic material.

17. The electronic device as described in claim 16, wherein the multiple discrete magnetic attachment points of the internal surface of the bottom housing portion comprise multiple magnets that protrude from the internal surface of the bottom housing portion and extend into respective cavities of corresponding nuts on the circuit board.

18. The electronic device as described in claim 14, wherein the multiple discrete magnetic attachment points of the internal surface of bottom housing portion comprise magnets, and the multiple corresponding discrete magnetic attachment points of the circuit board comprise magnetic material magnetically attached to the magnets.

19. An electronic device comprising:
  a housing having multiple magnets protruding from an internal surface of the housing; and
  an electronic component for the electronic device, the electronic component positioned within the housing and magnetically attached to the internal surface of the housing via a magnetic force between multiple nuts disposed on the electronic component and the multiple magnets protruding from the internal surface of the housing,
  wherein the multiple magnets protruding from the internal surface of the housing extend into corresponding cavities in the nuts.

20. The electronic device of claim 19, wherein the electronic component comprises a printed circuit board.

* * * * *